United States Patent
Jiang

(10) Patent No.: US 11,686,753 B2
(45) Date of Patent: Jun. 27, 2023

(54) CAPACITANCE DETECTION METHOD AND CIRCUIT

(71) Applicant: SHENZHEN GOODIX TECHNOLOGY CO., LTD., Shenzhen (CN)

(72) Inventor: Hong Jiang, Shenzhen (CN)

(73) Assignee: SHENZHEN GOODIX TEOHNOLOGY CO., LTD., Shenzhen (CN)

(*) Notice: Subject to any disclaimer, the term of this patent is extended or adjusted under 35 U.S.C. 154(b) by 343 days.

(21) Appl. No.: 17/010,796

(22) Filed: Sep. 2, 2020

(65) Prior Publication Data

US 2021/0033655 A1 Feb. 4, 2021

Related U.S. Application Data

(63) Continuation of application No. PCT/CN2019/098899, filed on Aug. 1, 2019.

(51) Int. Cl.
 *G01R 27/26* (2006.01)
 *G01D 5/24* (2006.01)
 *G06F 3/044* (2006.01)

(52) U.S. Cl.
 CPC ......... *G01R 27/2605* (2013.01); *G01D 5/24* (2013.01); *G06F 3/044* (2013.01)

(58) Field of Classification Search
 CPC ...... G01R 27/2605; G01D 5/24; G06F 3/044; G06F 3/04166
 See application file for complete search history.

(56) References Cited

U.S. PATENT DOCUMENTS

2007/0176609 A1 8/2007 Ely et al.
2017/0010717 A1* 1/2017 Kim ................... G06F 3/0446
2019/0302928 A1 10/2019 Yuan et al.

FOREIGN PATENT DOCUMENTS

| CN | 101738543 A | 6/2010 |
|---|---|---|
| CN | 103902114 | 7/2014 |
| CN | 206440771 | 8/2017 |
| CN | 108124464 | 6/2018 |
| CN | 108152598 A | 6/2018 |
| CN | 108475155 A | 8/2018 |
| EP | 3502855 | 6/2019 |
| EP | 3770738 | 1/2021 |

* cited by examiner

*Primary Examiner* — Amy He
(74) *Attorney, Agent, or Firm* — Emerson Thomson Bennett; Roger D. Emerson, Esq.

(57) ABSTRACT

A capacitance detection method and circuit are provided. The detection method includes: performing charging, base capacitance offsetting, and charge transferring successively on a capacitor to be detected in an i-th first offsetting process of the first offsetting processes, to generate a first output voltage, wherein i≤N; performing discharging, base capacitance offsetting, and charge transferring on the capacitor to be detected successively in a j-th second offsetting process of the second offsetting processes, to generate a second output voltage, wherein j≤M; and determining a capacitance variation of the capacitor to be detected before and after the capacitor to be detected is affected by an external electric field based on the first output voltages corresponding to N first offsetting processes and the second output voltages corresponding to M second offsetting processes in the detection period.

18 Claims, 7 Drawing Sheets

CAPACITANCE DETECTION METHOD AND CIRCUIT

CROSS-REFERENCE TO RELATED APPLICATION

This application is a continuation of International Application No. PCT/CN2019/098899, filed on Aug. 1, 2019, the application of which is hereby incorporated by reference in its entirety.

TECHNICAL FIELD

Embodiments of the present disclosure relate to the field of touch control technologies, and in particular to, a capacitance detection method and circuit.

BACKGROUND

The principle of self-capacitance detection is that a capacitor will be formed between a detection electrode and system ground, which is known as a self-capacitor. The capacitor formed between the detection electrode and the system ground has base capacitance or initial capacitance. When a finger approaches or touches the detection electrode, capacitance between the detection electrode and the system ground will be increased, and a user-related touch control operation may be determined by detecting a variation of the capacitance.

In the field of capacitance touch control, a flexible screen is an important development direction. When implementing capacitive touch control detection using the above self-capacitance principle, the flexible screen tends to be thinner than a conventional capacitive touch screen, such that the detection electrode is closer to the system ground. Thus, base capacitance of the capacitor is obviously higher than base capacitance of the capacitor of the conventional capacitive touch screen. In addition, since a metal-mesh is used as the detection electrode, the sensing area is relatively small, such that when the finger implements touch control, the capacitance variation is small. A small capacitance variation means to require a high circuit gain, such that the detection circuit can detect an electrical signal generated by the capacitance variation during touching, but since the base capacitance is much higher than the capacitance variation, a high circuit gain, if employed, further tends to cause detection circuit saturation.

Further, the electrical signal caused by the small capacitance variation is also very small, and is easily submerged in circuit noise, thus failing to be detected. Thus, it can be seen that, the prior art has the defect of low self-capacitance detection sensitivity, finally resulting in low accuracy of the self-capacitance detection.

SUMMARY

In view of this, one of the technical problems solved by embodiments of the present disclosure is to provide a capacitance detection method, to overcome the above defect in the prior art.

An embodiment of the present disclosure provides a capacitance detection method. N first offsetting processes and M second offsetting processes constitute a detection period during detection, N, M≥1. The capacitance detection method includes:

performing charging, base capacitance offsetting, and charge transferring successively on a capacitor to be detected in an i-th first offsetting process of the first offsetting processes, to generate a first output voltage, i≤N;

performing discharging, base capacitance offsetting, and charge transferring on the capacitor to be detected successively in a j-th second offsetting process of the second offsetting processes, to generate a second output voltage, j≤M; and determining a capacitance variation of the capacitor to be detected before and after the capacitor to be detected is affected by an external electric field based on the first output voltages corresponding to the N first offsetting processes and the second output voltages corresponding to the M second offsetting processes in the detection period.

Alternatively, in any embodiment of the present disclosure, the performing base capacitance offsetting on a capacitor to be detected in an i-th first offsetting process of the first offsetting processes includes: performing base capacitance offsetting on a charge on the capacitor to be detected at least once in the i-th first offsetting process.

Alternatively, in any embodiment of the present disclosure, the performing base capacitance offsetting on a capacitor to be detected in an i-th first offsetting process of the first offsetting processes includes: discharging the capacitor to be detected through an offset capacitor to perform base capacitance offsetting on the capacitor to be detected.

Alternatively, in any embodiment of the present disclosure, the performing base capacitance offsetting on the capacitor to be detected in a j-th second offsetting process of the second offsetting processes includes: performing base capacitance offsetting on a charge on the capacitor to be detected at least once in the j-th second offsetting process.

Alternatively, in any embodiment of the present disclosure, the performing base capacitance offsetting on the capacitor to be detected in a j-th second offsetting process of the second offsetting processes includes: charging the capacitor to be detected through the offset capacitor to perform base capacitance offsetting on the capacitor to be detected.

Alternatively, in any embodiment of the present disclosure, the method further includes: switching between the first offsetting process and the second offsetting process under the control of a first switching module.

Alternatively, in any embodiment of the present disclosure, the first switching module includes at least three first switches, where at least one of the first switches is provided in a driving module configured to charge the capacitor to be detected in a first offsetting stage or discharge the capacitor to be detected in a second offsetting stage, and at least two other first switches of the first switches are provided in an offsetting module configured to perform base capacitance offsetting on the capacitor to be detected.

Alternatively, in any embodiment of the present disclosure, the method further includes: charging and discharging the offset capacitor by the offsetting module under the control of a third switching module, to perform base capacitance offsetting on the capacitor to be detected in the i-th first offsetting process or the j-th second offsetting process.

Alternatively, in any embodiment of the present disclosure, the charging and discharging the offset capacitor under the control of a third switching module, to perform base capacitance offsetting on the capacitor to be detected in the i-th first offsetting process includes: charging and discharging the offset capacitor under the control of the third switching module such that a voltage of the capacitor to be detected is decreased to implement base capacitance offsetting on the capacitor to be detected.

Alternatively, in any embodiment of the present disclosure, the charging and discharging the offset capacitor by the offsetting module under the control of a third switching module, to perform base capacitance offsetting on the capacitor to be detected in the i-th first offsetting process or the j-th second offsetting process includes: charging and discharging the offset capacitor under the control of the third switching module such that the voltage of the capacitor to be detected is increased to implement base capacitance offsetting on the capacitor to be detected.

Alternatively, in any embodiment of the present disclosure, the third switching module includes at least two third switches, and the at least two third switches are provided in the offsetting module.

Alternatively, in any embodiment of the present disclosure, under the control of a fourth switching module, charge transferring on the capacitor to be detected is performed in the i-th first offsetting process or charge transferring on the capacitor to be detected is performed in the j-th second offsetting process.

Alternatively, in any embodiment of the present disclosure, the fourth switching module includes at least one fourth switch, and the fourth switch is configured to enable the capacitor to be detected to be in a charge transferring state in the i-th first offsetting process, or enable the capacitor to be detected to be in a charge transferring state in the j-th second offsetting process.

Alternately, in any embodiment of the present disclosure, the N first offsetting processes precede the M second offsetting processes, or the i-th first offsetting process alternates with the j-th second offsetting process.

In the technical solutions provided by the embodiments of the present disclosure, since N first offsetting processes and M second offsetting processes constitute a detection period, N, M≥1, the detection method includes: performing charging, base capacitance offsetting, and charge transferring successively on a capacitor to be detected in an i-th first offsetting process of the first offsetting processes, to generate a first output voltage, i≤N; performing discharging, base capacitance offsetting, and charge transferring on the capacitor to be detected successively in a j-th second offsetting process of the second offsetting processes, to generate a second output voltage, j≤M; and determining a capacitance variation of the capacitor to be detected before and after the capacitor to be detected is affected by an external electric field based on the first output voltages corresponding to the N first offsetting processes and the second output voltages corresponding to the M second offsetting processes in the detection period. When the detection method is applied to self-capacitance detection, detected base capacitance of the capacitor to be detected can be eliminated or reduced by charge offsetting, thereby improving the capacitance variation rate and enhancing the sensitivity of the self-capacitance detection in the case where the capacitance variation remains unchanged, and finally improving the accuracy of the self-capacitance detection.

BRIEF DESCRIPTION OF THE DRAWINGS

Some specific embodiments of embodiments of the present disclosure will be described in detail below with reference to the accompanying drawings, in an example manner, instead of a non-limiting manner. Identical reference numerals in the accompanying drawings represent identical or similar components or parts. As will be appreciated by those skilled in the art, these accompanying drawings may not be drawn to scale. In the drawings.

DETAILED DESCRIPTION

Any technical solution of embodiments of the present disclosure may not necessarily be implemented to achieve all of the above advantages.

In the technical solutions provided by the embodiments of the present disclosure, since N first offsetting processes and M second offsetting processes constitute a detection period, N, M≥1, the detection method includes: performing charging, base capacitance offsetting, and charge transferring successively on a capacitor to be detected in an i-th first offsetting process of the first offsetting processes, to generate a first output voltage, i≤N; performing discharging, base capacitance offsetting, and charge transferring on the capacitor to be detected successively in a j-th second offsetting process of the second offsetting processes, to generate a second output voltage, j≤M; and determining a capacitance variation of the capacitor to be detected before and after the capacitor to be detected is affected by an external electric field based on the first output voltages corresponding to the N first offsetting processes and the second output voltages corresponding to the M second offsetting processes in the detection period. When the detection method is applied to self-capacitance detection, detected base capacitance of the capacitor to be detected can be eliminated or reduced by charge offsetting, thereby improving the capacitance variation rate and enhancing the sensitivity of the self-capacitance detection in the case where the capacitance variation remains unchanged, and finally improving the accuracy of the self-capacitance detection.

Specific implementations of the embodiments of the present disclosure will be further illustrated below with reference to the accompanying drawings of the embodiments of the present disclosure.

Figure 1:
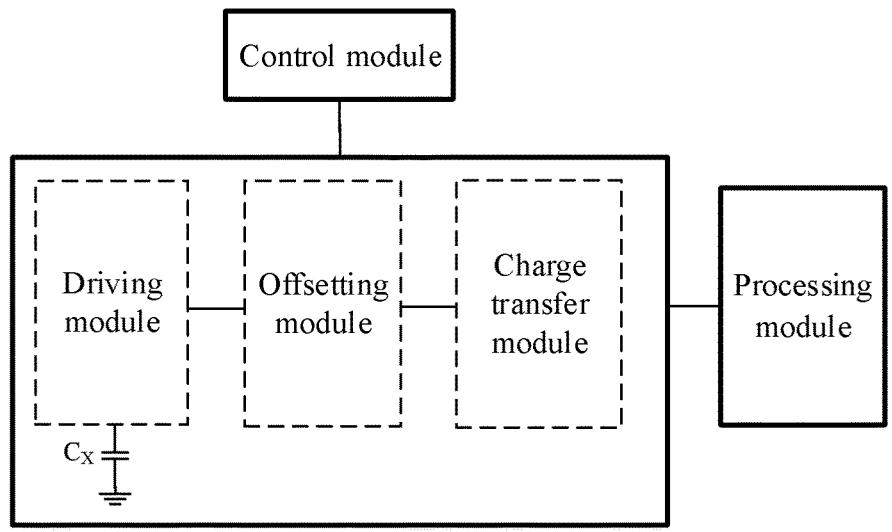
FIG. 1 is a schematic structural diagram of a capacitance detection circuit in embodiment I of the present disclosure.

FIG. 1 is a schematic structural diagram of a capacitance detection circuit in embodiment I of the present disclosure. As shown in FIG. 1, the capacitance detection circuit includes: a control module, a driving module, an offsetting module, a charge transfer module, and a processing module. The driving module, the offsetting module, and the charge transfer module may be specifically provided in a frontend circuit. The control module is configured to charge and discharge the capacitor to be detected Cx by controlling the driving module, and offset base capacitance of the capacitor to be detected by controlling the offsetting module; the charge transfer module is configured to perform charge transferring on the capacitor to be detected to generate an output voltage (i.e., a first output voltage, and a second output voltage in the following example); and the processing module is configured to determine a capacitance variation of the capacitor to be detected before and after the capacitor to be detected is affected by an external electric field based on the output voltage. The processing module may specifically include an anti-alias filter (AAF for short) and an analog-digital converter (ADC for short). The anti-alias filter filters the output voltage (i.e., Vout below) of the charge transfer module. Then, raw data obtained by sampling through the analog-digital converter, and then by quadrature (IQ) demodulation through a digital signal processor (DSP for short) is sent to a CPU for coordinate computation, to obtain a touch position.

In the embodiment of the present disclosure, in order to eliminate the influence of the base capacitance of the capacitor to be detected as far as possible, when the capacitance detection circuit is working, a detection period includes N first offsetting processes (also referred to as positive processes) and M second offsetting processes (also referred to as negative processes), N, M≥1. The principle of offsetting is described below by way of an example with reference to a specific electrical connection relationship presented by the capacitance detection circuit and a control sequence of switches in the capacitance detection circuit in the first offsetting processes and the second offsetting processes respectively.

Figure 2:
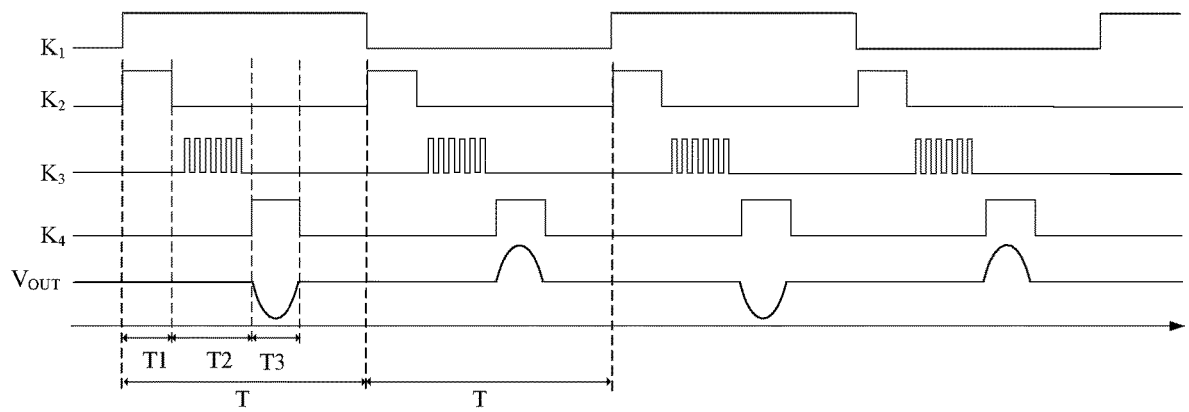
FIG. 2 is a schematic diagram of a control sequence of switches in embodiment II of the present disclosure.
Figure 3A:
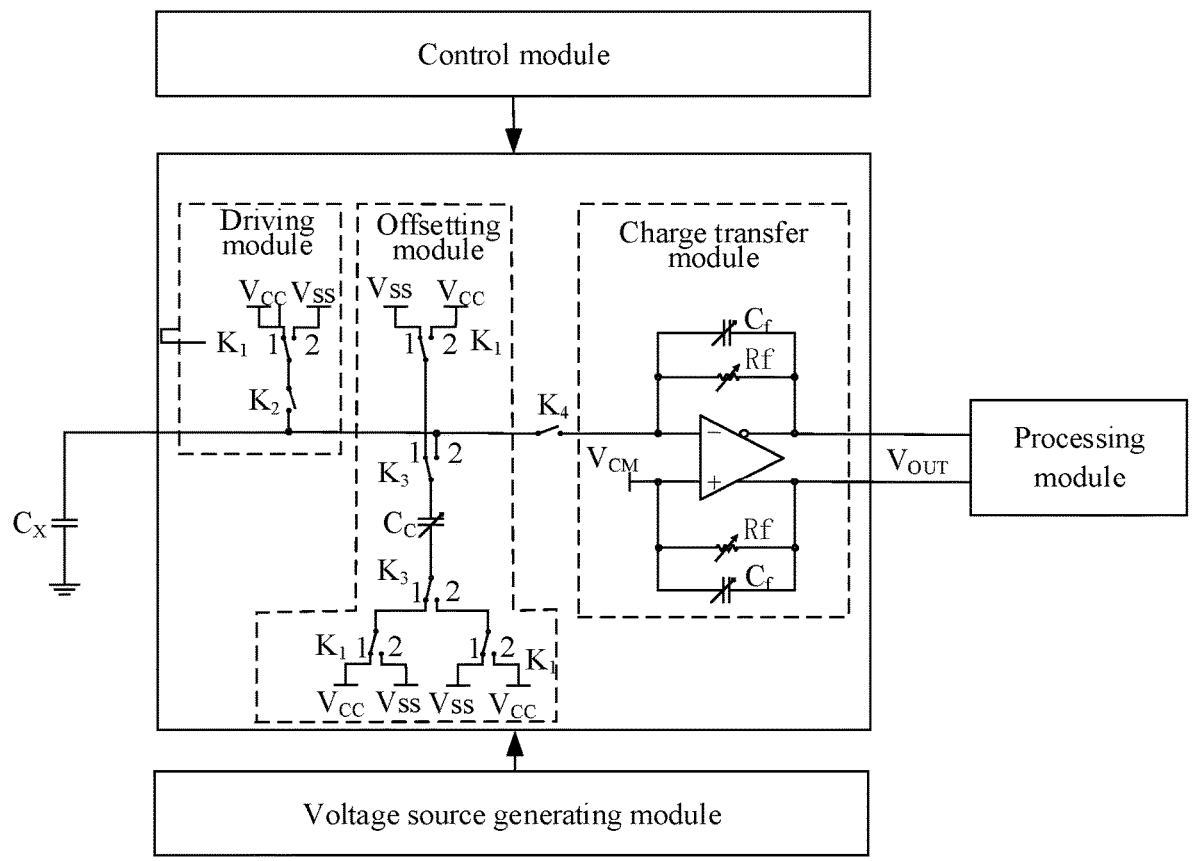
FIG. 3A is a schematic diagram of a specific electrical connection relationship of a capacitance detection circuit in a first offsetting process in embodiment III of the present disclosure.

FIG. 2 is a schematic diagram of a control sequence of switches in embodiment II of the present disclosure. FIG. 3A is a schematic diagram of a specific electrical connection relationship of a capacitance detection circuit in a first offsetting process in embodiment III of the present disclosure. As shown in FIG. 2 and FIG. 3A, a specific capacitance detection circuit is provided from the perspective of a specific circuit implementation by way of an example.

Specifically, in the capacitance detection circuit shown in FIG. 3A, the driving module specifically includes: a first switch K1, a second switch K2, a voltage source Vcc, and a voltage source Vss. The first switch K1 is a single-pole double-throw switch, and the second switch K2 is a single-pole single-throw switch, which corresponds to two contacts, denoted as contact 1 and contact 2 respectively, for connection to the voltage source Vcc or Vss respectively.

Specifically, in the capacitance detection circuit shown in FIG. 3A, the offsetting module specifically includes: three first switches K1, two third switches K3, an offset capacitor Cc, the voltage source Vcc, and the voltage source Vss. Each of the first switches K1 corresponds to two contacts, namely the contact 1 and the contact 2, for connection to the voltage source Vcc or Vss. The third switch K3 also corresponds to two contacts, namely the contact 1 and the contact 2, such that one terminal of the third switch is connected to the first switch K1 or the offset capacitor Cc; and the other terminal of the third switch is connected to the voltage source Vcc or Vss. Here, it should be noted that switches with a given reference numeral are not essentially a given switch, and actually mean that the switches may have a synchronous switching state based on the technical thoughts of the present disclosure.

Specifically, in the capacitance detection circuit shown in FIG. 3A, a charge transfer module is specifically a double-terminal fully differential amplifying circuit. A normal phase terminal of the double-terminal fully differential amplifying circuit is connected to a common mode voltage (Vcm). A feedback resistor Rf and a feedback capacitor Cf are provided between the normal phase terminal and an output terminal, and between a negative phase terminal and the output terminal, of the double-terminal fully differential amplifying circuit.

Specifically, in the capacitance detection circuit shown in FIG. 3A, a fourth switch K4 is also provided between the charge transfer module and the processing module. The fourth switch K4 may be included in the offsetting module, or may be included in the charge transfer module, or may be independent of the offsetting module and the charge transfer module.

In addition, the capacitance detection circuit shown in FIG. 3A further includes: a voltage source generating module configured to generate the voltage source Vcc, Vss, or Vcm. The capacitance detection circuit shown in FIG. 3A further includes a control module configured to generate control signals for the first switch K1, the second switch K2, the third switch K3, and the fourth switch K4, including an on-off control signal controlling on or off of a switch or a contact switching control signal controlling contact switching to make the switches be in different conducting states.

The switches in the capacitance detection circuit shown in FIG. 3A may be the single-pole single-throw switches or the single-pole double-throw switches as required in a working process, a switching state of the single-pole single-throw switches is on or off, and a switching state of the single-pole double-throw switches can achieve different conducting states by switching of contacts. Therefore, specific circuit states presented by the capacitance detection circuit in the process of implementing capacitance variation detection are described below with reference to specific switching states of these switches.

Further referring to FIG. 3A, a specific circuit state presented by the capacitance detection circuit in the process of implementing capacitance variation detection is actually schematically shown. A first offsetting process includes a first stage to a third stage below.

(1) The First Offsetting Process:

The first stage (T1): the first switch K1 is connected to the contact 1, the second switch K2 is closed, the third switch K3 is connected to the contact 1, and the fourth switch K4 is disconnected. In this case, one terminal of the capacitor to be detected Cx is grounded, and the other terminal of it is connected to the voltage source Vcc through the first switch and the second switch, such that it is in a charging state, and its voltage to ground is Vcc after charging is completed. One terminal of the offset capacitor Cc is connected to the voltage source Vss through the first switch and the third switch, and the other terminal of it is connected to the voltage source Vcc through another first switch and another third switch, such that it is also in a charging state, and its voltage to ground is Vcc−Vss after charging is completed. In this case, since the fourth switch is disconnected, the offsetting module is disconnected from the charge transfer module.

The second stage (T2): The first switch K1 is connected to the contact 1, the second switch K2 is disconnected, the connection of the third switch K3 is switched from the contact 1 to the contact 2, and the fourth switch K4 is disconnected. A voltage to ground of the offset capacitor jumps to Vss−Vcm, which is lower than the voltage Vcc of the capacitor to be detected Cx, and the capacitor to be detected Cx charges the offset capacitor Cc, thereby implementing charge offsetting on the capacitor to be detected Cx through the offset capacitor Cc. The connection of the third switch K3 is switched from the contact 2 to the contact 1, and its voltage to ground is Vcc−Vss after charging is completed. The connection of the third switch K3 is switched from the contact 1 to the contact 2, the capacitor to be detected positively charges the offset capacitor again, i.e., performing charge offsetting on the capacitor to be detected Cx again, and so on. That is, in the second stage, the third switch K3 alternately switches between the contact 1 and the contact 2, thereby implementing charge offsetting on the capacitor to be detected Cx multiple times (denoted as M times). The voltage of the capacitor to be detected is decreased by (Vcc−Vss−(Vss−Vcm))*Cc/Cx each time, and is finally decreased to or approximately decreased to the common mode voltage.

Here, it should be noted that, since two first switches are also configured in the offsetting module, the two first switches are required to be involved in charging and discharging of the offset capacitor Cc. The connection between the first switch and the contact is only required to ensure that a voltage of the offset capacitor can reach Vcc−Vss when the third switch is connected to the contact 1, while the capacitor to be detected can discharge the offset capacitor when the third switch is connected to the contact 2. Therefore, for example, in the embodiment of FIG. 3A, the offsetting module is connected to the voltage source Vcc when one of its first switches is connected to the contact 1, and is connected to the voltage source Vss when the first switch is connected to the contact 2; otherwise the offsetting module is connected to the voltage source Vss when the other first switch is connected to the contact 1, and is connected to the voltage source Vcc when the other first switch is connected to the contact 2.

When the second stage is completed, the influence of the base capacitance of the capacitor to be detected is completely eliminated. If there is no touch, then Vout=0. In this case, a voltage of a negative phase terminal of a differential amplifier is Vcm, i.e., both the voltage to ground of the offset capacitor and a voltage to ground of the capacitor to be detected is the common mode voltage Vcm. Therefore, there is the following equation (1):

$$(Vcc-Vcm)*Cx=M*Cc*(Vcc-Vss-(Vss-Vcm) \quad (1)$$

Considering that an appropriate size of the offset capacitor needs to be selected in a circuit design stage, the following equation (2) is obtained by transforming the above equation:

$$Cc=[(Vcc-Vcm)*Cx]/[M*(Vcc-2Vss+Vcm)] \quad (2)$$

In the above equation (2), each voltage source is known, and in the equation (2), Cx actually represents the base capacitance of the capacitor to be detected.

The third stage (T3): When the second switch K2 is disconnected, the fourth switch K4 is closed. Since the offsetting in the second stage is completed, the third switch K3 may be connected to either the contact 1 or the contact 2, and the charge transfer module performs charge transferring on the capacitor to be detected.

As long as a circuit design ensures that the base capacitance of the capacitor to be detected and capacitance of the offset capacitor have the relationship in the above equation (2), the influence of the base capacitance of the capacitor to be detected on charge transfer can be eliminated. When there is an external electric field, only the influence of the external electric field is retained.

Figure 3B:
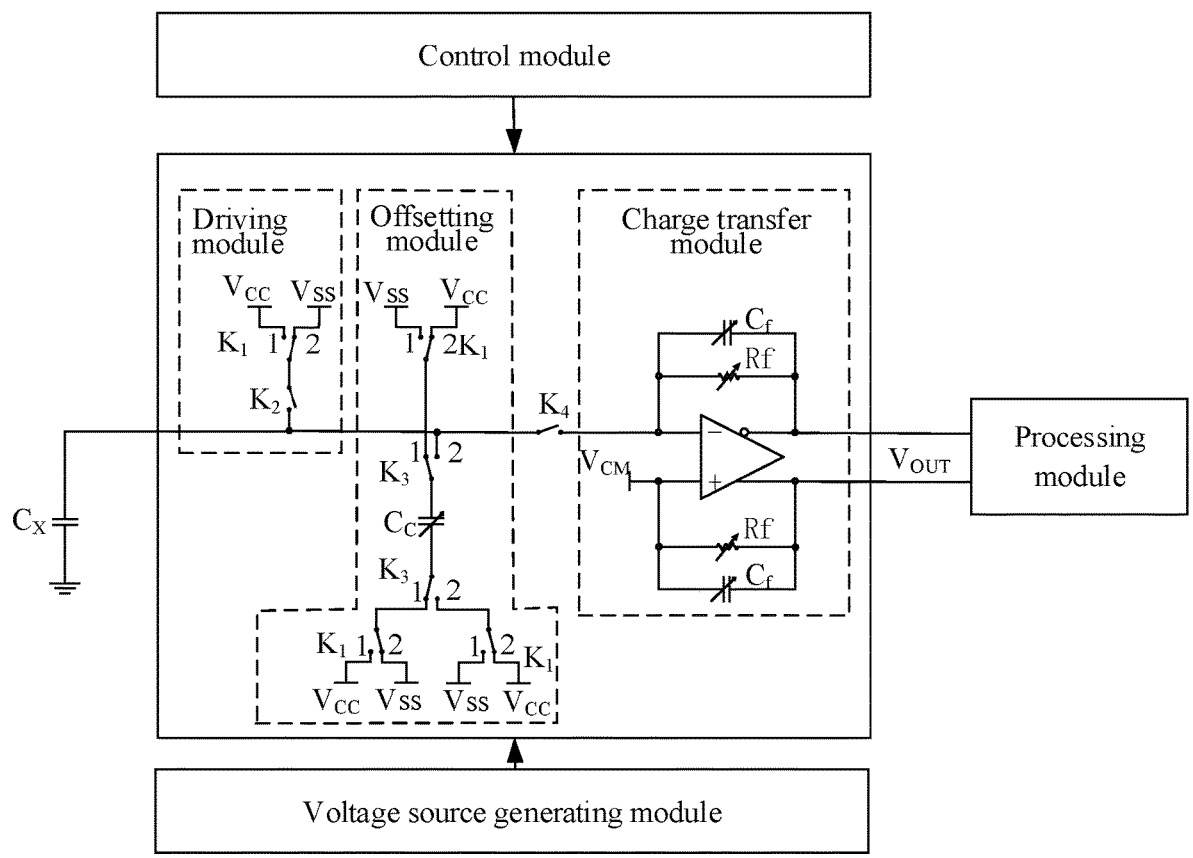
FIG. 3B is a schematic diagram of a specific electrical connection relationship of the capacitance detection circuit in a second offsetting process in embodiment III of the present disclosure.

FIG. 3B is a schematic diagram of a specific electrical connection relationship of the capacitance detection circuit in a second offsetting process in embodiment III of the present disclosure. As shown in FIGS. 2 and 3B, a specific capacitance detection circuit is provided from the perspective of a specific circuit implementation by way of an example.

Further referring to FIG. 3B, a schematic diagram of the specific electrical connection relationship of the capacitance detection circuit in the second offsetting process in embodiment III of the present disclosure is shown. As shown in FIG. 3B, a specific capacitance detection circuit is provided from the perspective of a specific circuit implementation by way of an example.

The Second Offsetting Process Includes a First Stage to a Third Stage Below:

The first stage (T1): the first switch K1 is connected to the contact 2, the second switch K2 is closed, the third switch K3 is connected to the contact 1, and the fourth switch K4 is disconnected. In this case, one terminal of the capacitor to be detected Cx is grounded, and the other terminal of it is connected to the voltage source Vss through the first switch and the second switch, such that it is in a discharging state, and its voltage to ground is Vss after discharging is completed. One terminal of the offset capacitor Cc is connected to the voltage source Vcc through the first switch and the third switch, and the other terminal of it is connected to the voltage source Vss through another first switch and another third switch, such that it is also in a discharging state, and its voltage to ground is Vss−Vcc after discharging is completed. In this case, since the third switch is disconnected, the offsetting module is disconnected from the charge transfer module.

The second stage (T2): The first switch K1 is connected to the contact 2, the second switch K2 is disconnected, the connection of the third switch K3 is switched from the contact 1 to the contact 2, and the fourth switch K4 is disconnected. A voltage to ground of the offset capacitor jumps to Vcm−Vcc, and the offset capacitor charges the capacitor to be detected, thereby implementing charge offsetting on the capacitor to be detected Cx through the offset capacitor Cc. The connection of the third switch K3 is switched from the contact 2 to the contact 1, and the voltage to ground of the offset capacitor is Vcc−Vss after discharging is completed; the connection of the third switch K3 is switched from the contact 1 to the contact 2, and the capacitor to be detected recharges the offset capacitor, i.e., performing charge offsetting on the capacitor to be detected Cx again, and so on. That is, in the second stage, the third switch K3 alternately switches between the contact 1 and the contact 2, thereby implementing charge offsetting on the capacitor to be detected Cx multiple times (denoted as M times). The voltage of the capacitor to be detected is increased by (Vcc−Vss−Vcm+Vcc)*Cc/Cx each time, and is finally increased to or approximately increased to the common mode voltage. In addition, through multiple times of charge offsetting, the offset capacitor Cc can be designed to be small enough, so as not to occupy too much area of a touch chip.

Here, it should be noted that, since two first switches are also configured in the offsetting module, the two first switches are required to be involved in charging and discharging of the offset capacitor Cc. The connection between the first switch and the contact is only required to ensure that a voltage of the offset capacitor can reach Vcc−Vss when the third switch is connected to the contact 1, while the voltage of the offset capacitor can reach Vcm−Vcc, and the capacitor to be detected can discharge the offset capacitor when the third switch is connected to the contact 2. Therefore, for example, in the embodiment of FIG. 3B, the offsetting module is connected to the voltage source Vcc when one of its two first switches is connected to the contact 1, and is connected to the voltage source Vss when the first switches is connected to the contact 2; otherwise the offsetting module is connected to the voltage source Vss when the other first switch is connected to the contact 1, and is connected to the voltage source Vcc when the other first switch is connected to the contact 2.

When the second stage is completed, the influence of the base capacitance of the capacitor to be detected is completely eliminated, and then both the voltage of the offset capacitor and the voltage of the capacitor to be detected are the common mode voltage. Therefore, there is the following equation (3):

$$(Vcm-Vss)*Cx=M*Cc*(Vcc-Vss-Vcm+Vcc) \quad (3)$$

Considering that an appropriate size of the offset capacitor needs to be selected in a circuit design stage, the following equation (4) is obtained by transforming the above equation:

$$Cc=[(Vcm-Vss)*Cx]/[M*(2Vcc-Vss-Vcm)] \quad (4)$$

In the above equation (4), each voltage source is actually a known quantity, while in the equation (4), Cx actually represents the base capacitance of the capacitor to be detected.

The third stage (T3): When the second switch K2 is disconnected, the fourth switch K4 is closed. Since the offsetting in the second stage is completed, the third switch K3 may be connected to either the contact 1 or the contact 2, and the charge transfer module performs charge transferring on the capacitor to be detected.

As long as a circuit design ensures that the base capacitance of the capacitor to be detected and capacitance of the offset capacitor have the relationship in the above equation (3), the influence of the base capacitance of the capacitor to be detected on charge transfer can be eliminated. When there is an external electric field, only the influence of the external electric field is retained.

Therefore, in the circuit design stage, it is only necessary to set the capacitance of the offset capacitor to the base capacitance of the capacitor to be detected, whilst satisfying both of the above equations (2) and (4), and the offset capacitor is preferably a stable capacitor with constant capacitance, i.e., its capacitance will not change due to the influence of the external electric field.

With reference to the switch control sequence shown in the above FIG. 2 and the schematic diagrams of the electrical connection relationships of the capacitance detection circuit during working shown in FIG. 3A and FIG. 3B, a capacitance detection method is provided correspondingly. N first offsetting processes and M second offsetting processes constitute a detection period during detection, N, M≥1. The method includes: performing charging, base capacitance offsetting, and charge transferring successively on a capacitor to be detected in an i-th first offsetting process of the first offsetting processes, to generate a first output voltage, i≤N; performing discharging, base capacitance offsetting, and charge transferring on the capacitor to be detected successively in a j-th second offsetting process of the second offsetting processes, to generate a second output voltage, j≤M. Here, there are no strict timing sequence requirements for the first offsetting processes and the second offsetting processes. One of the first offsetting process and one of the second offsetting processes may be in a group, where the first offsetting process and the second offsetting process are executed alternately, i.e., similarly, the i-th first offsetting process alternates with the j-th second offsetting process. Alternatively, the N first offsetting processes (as a whole) precede the M second offsetting processes (as a whole). Preferably, N is equal to M and i=j, such that the performance after offsetting is as optimal as possible. However, in some application scenarios, N may also be unequal to M.

In order to clearly illustrate the principle of the present disclosure, the description is made below by taking a detection period including one of the first offsetting processes and one of the second offsetting processes as an example, i.e., i=j=N=M=1. When one detection period includes a plurality of first offsetting processes and a plurality of second offsetting processes, the principle of its implementation is similar to that of one of the first offsetting processes and one of the second offsetting processes, and therefore will not be described by separately listing an embodiment.

Figure 4:
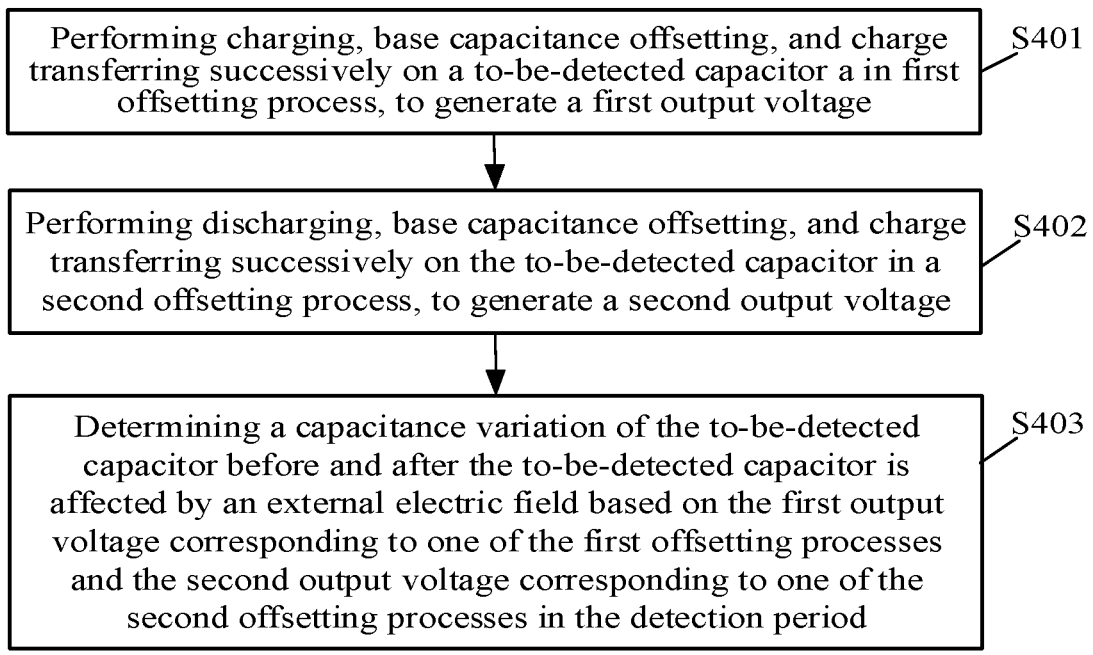
FIG. 4 is a schematic flowchart of a capacitance detection method in embodiment IV of the present disclosure.

FIG. 4 is a schematic flowchart of a capacitance detection method in embodiment IV of the present disclosure. Further referring to the above FIGS. 3A and 3B, when the above step S401 is executed, switching between the first offsetting processes and the second offsetting processes is performed under the control of the first switching module. Specifically, the first switching module includes at least three first switches, where at least one of the first switches is provided in a driving module configured to charge the capacitor to be detected in the first offsetting stage or discharge the capacitor to be detected in a second offsetting stage, and at least two other first switches of the first switches are provided in an offsetting module configured to perform base capacitance offsetting on the capacitor to be detected.

Of course, here, it should be noted that the number of first switches here is merely an example, and in fact, the number of first switches may be flexibly set based on an application scenario.

As shown in FIG. 4, in this embodiment, the capacitance detection method includes the following steps:

S401: performing charging, base capacitance offsetting, and charge transferring successively on a capacitor to be detected in a first offsetting process, to generate a first output voltage.

When step S401 is executed, an electrical connection relationship of each structure in the capacitance detection circuit is shown in FIG. 3A.

It should be noted that, in step S401, base capacitance offsetting on a charge on the capacitor to be detected is performed at least once (specifically, e.g., M times) in the first offsetting process. Since the voltage source Vcc is greater than Vcm during a circuit design, a voltage of the charged capacitor to be detected is higher than Vcm in a first process stage, and a voltage of an offset capacitor is Vss−Vcc, which is actually a negative voltage (similar to discharging or referred to as negatively charging). In the offsetting stage, the voltage of the offset capacitor changes to Vcm−Vss (similar to charging or negatively discharging) again, which is actually a positive voltage since Vcm is greater than Vss. Therefore, in order to implement offsetting at least once, a third switch is controlled to switch between the contact 1 and the contact 2. After offsetting once, the voltage of the capacitor to be detected is decreased. After multiple times of offsetting, the voltage of the capacitor to be detected is decreased to be equal to or approximately equal to the common mode voltage Vcm, i.e., the first output voltage generated after the charge transferring is close to the common mode voltage Vcm.

That is, similarly, in any embodiment of the present disclosure, if a detection period includes N first offsetting processes: the offset capacitor is charged and discharged under the control of a third switching module, to perform base capacitance offsetting on the capacitor to be detected in an i-th first offsetting process of the first offsetting processes.

A second switching module specifically includes, e.g., the third switch in FIGS. 3A and 3B, and is provided in the offsetting module configured to perform base capacitance offsetting on the capacitor to be detected.

That is, similarly, if a detection period includes N first offsetting processes, when performing base capacitance offsetting on the capacitor to be detected in the i-th first offsetting process, the capacitor to be detected is discharged through the offset capacitor to implement base capacitance offsetting on the capacitor to be detected. As mentioned above, in the first offsetting stage, the voltage of the charged capacitor to be detected is Vcc, which is greater than Vcm. Therefore, the offset capacitor needs to discharge the capacitor to be detected, such that its voltage is decreased toward Vcm until being equal to or close to Vcm.

S402: performing discharging, base capacitance offsetting, and charge transferring successively on the capacitor to be detected in a second offsetting process, to generate a second output voltage.

Similar to the above step S401, the charging and discharging the offset capacitor by the offsetting module under the control of a third switching module, to perform base capacitance offsetting on the capacitor to be detected in the j-th first offsetting process or the second offsetting process includes: charging and discharging the offset capacitor under the control of the third switching module such that the voltage of the capacitor to be detected is increased to implement base capacitance offsetting on the capacitor to be detected.

Similarly, if the detection period includes M first offsetting processes, then the charging and discharging the offset capacitor by the offsetting module under the control of a third switching module, to perform base capacitance offsetting on the capacitor to be detected in the j-th first offsetting process or the second offsetting process includes: charging and discharging the offset capacitor under the control of the third switching module such that the voltage of the capacitor to be detected is increased to implement base capacitance offsetting on the capacitor to be detected. Further, under the control of the third switching module, charge transferring on the capacitor to be detected is performed in the j-th second offsetting process.

In this embodiment, the fourth switching module includes at least one fourth switch, and the fourth switch is configured to enable the capacitor to be detected to be in a charge transferring state in the first offsetting process, or enable the capacitor to be detected to be in a charge transferring state in the second offsetting process. Similarly, the fourth switch is configured to enable the capacitor to be detected to be in a charge transferring state in the i-th first offsetting process, or enable the capacitor to be detected to be in a charge transferring state in the j-th second offsetting process.

S403: determining a capacitance variation of the capacitor to be detected before and after the capacitor to be detected is affected by an external electric field based on the first output voltage corresponding to one of the first offsetting processes and the second output voltage corresponding to one of the second offsetting processes in the detection period.

Similarly, if a detection period includes N first offsetting processes and M second offsetting processes, the N first offsetting processes correspond to N first output voltages, and the M second offsetting processes correspond to M second output voltages. The capacitance variation of the capacitor to be detected before and after the capacitor to be detected is affected by the external electric field is determined based on the N first output voltages corresponding to the N first offsetting processes and the M second output voltages corresponding to the M second offsetting processes in the detection period. N may be equal to M, or N may be unequal to M.

As shown in FIG. 2, after the first offsetting processes and the second offsetting processes, the first output voltages and the second output voltages of a charge transfer module are positively and negatively symmetrical about the common mode voltage Vcm. In a first offsetting process and a second offsetting process that are adjacent to each other, a low frequency noise is approximately a constant offset. This offset will make Vout change in a given direction. For example, a value of Vout is increased toward a direction, while will be decreased toward another direction opposite to the direction, and the finally obtained peak-to-peak value remains unchanged, such that the low frequency noise is effectively suppressed.

If the capacitance detection circuit can achieve a completely offsetting state, then capacitance of the capacitor to be detected becomes Cx+ΔC when the capacitor to be detected is touched. The influence of the base capacitance Cx of the capacitor to be detected on the circuit is offset by the offset capacitor Cc, such that a voltage outputted by the charge transfer module only reflects the capacitance variation ΔC.

Figure 5:
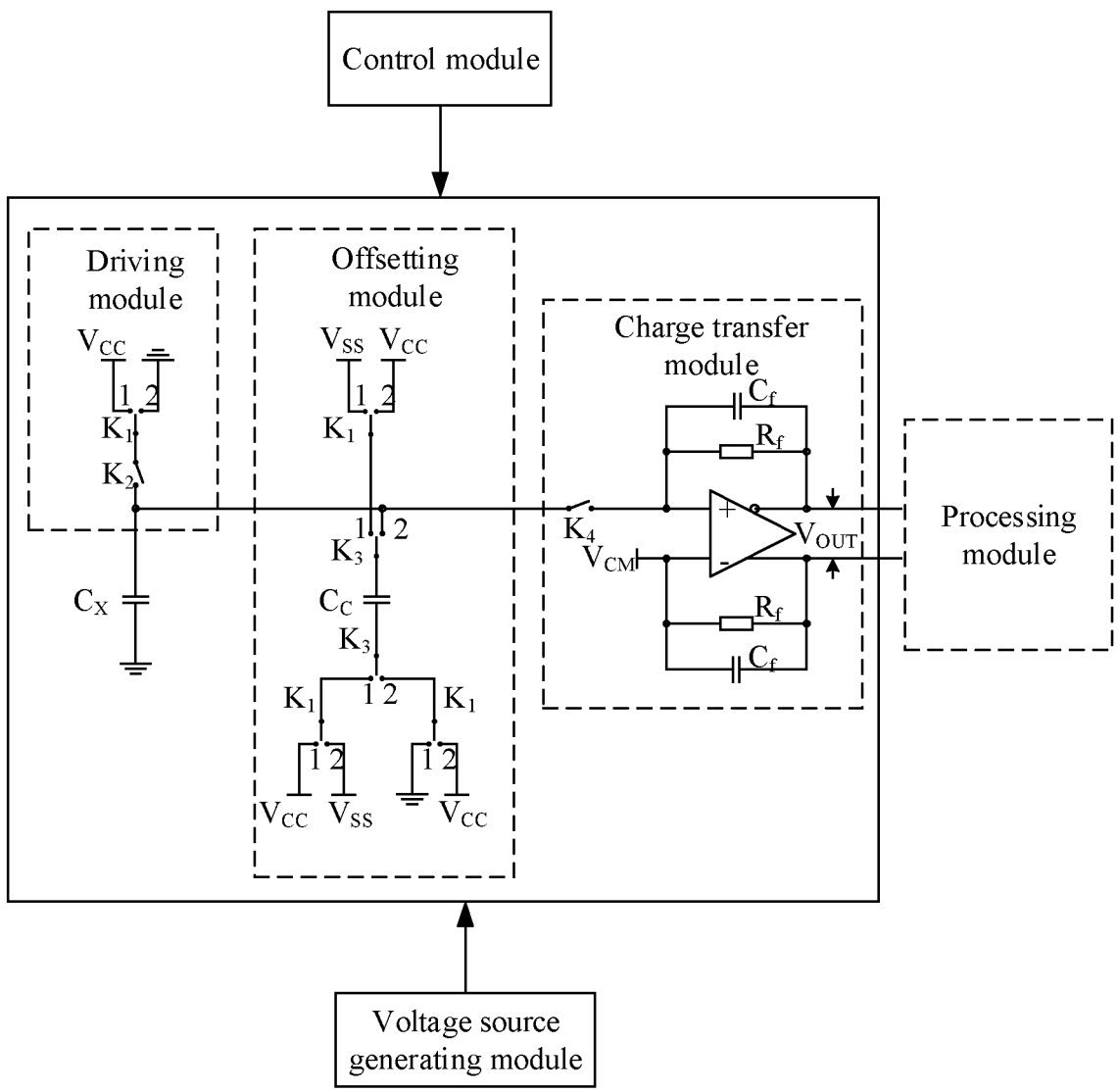
FIG. 5 is a schematic flowchart of a capacitance detection method in embodiment V of the present disclosure.

FIG. 5 is a schematic structural diagram of a capacitance detection circuit in embodiment V of the present disclosure. As shown in FIG. 5, different from the structure of the capacitance detection circuit shown in the above FIGS. 3A and 3B, specifically, in the capacitance detection circuit shown in FIG. 3A and FIG. 3B, the voltage source Vss in the driving module is replaced with GND; and a voltage source Vss in the offsetting module is replaced with GND.

With reference to the structure of the capacitance detection circuit shown in FIG. 5, the first offsetting process includes a first stage to a third stage below.

(1) The First Offsetting Process:

The first stage (T1): the first switch K1 is connected to the contact 1, the second switch K2 is closed, the third switch K3 is connected to the contact 1, and the fourth switch K4 is disconnected. In this case, one terminal of the capacitor to be detected Cx is grounded, and the other terminal of it is connected to the voltage source Vcc through the first switch and the second switch, such that it is in a charging state, and its voltage to ground is Vcc after charging is completed. One terminal of the offset capacitor Cc is connected to the voltage source Vss through the first switch and the third switch, and the other terminal of it is connected to the voltage source Vcc through another first switch and another third switch, such that it is also in a charging state, and its voltage is Vcc−Vss after charging is completed. In this case, since the third switch is disconnected, the offsetting module is disconnected from the charge transfer module.

The second stage (T2): the first switch K1 is connected to the contact 1, the second switch K2 is disconnected, the connection of the third switch K3 is switched from the contact 1 to the contact 2, and the fourth switch K4 is disconnected. A voltage of the offset capacitor is Vcm, which is lower than the voltage Vcc of the capacitor to be detected Cx, and the capacitor to be detected charges the offset capacitor, thereby implementing charge offsetting on the capacitor to be detected Cx through the offset capacitor Cc. The connection of the third switch K3 is switched from the contact 2 to the contact 1, and its voltage is Vcc−Vss after charging is completed; the connection of the third switch K3 is switched from the contact 1 to the contact 2, and the capacitor to be detected positively charges the offset capacitor again, i.e., performing charge offsetting on the capacitor to be detected Cx again, and so on. That is, in the second stage, the third switch K3 alternately switches between the contact 1 and the contact 2, thereby implementing charge offsetting on the capacitor to be detected Cx multiple times (denoted as M times). The voltage of the capacitor to be detected is decreased by (Vcc−Vss−Vcm)*Cc/Cx each time, and is finally decreased to or approximately decreased to the common mode voltage.

When the second stage is completed, the influence of the base capacitance of the capacitor to be detected is completely eliminated, and then both the voltage of the offset capacitor and the voltage of the capacitor to be detected are the common mode voltage. Therefore, there is the following equation (5):

$$(Vcc-Vcm)*Cx=M*Cc*(Vcc-Vss-Vcm) \quad (5)$$

Considering that an appropriate size of the offset capacitor needs to be selected in a circuit design stage, the following equation (6) is obtained by transforming the above equation:

$$Cc=[(Vcc-Vcm)*Cx]/[M*(Vcc-Vss-Vcm)] \quad (6)$$

In the above equation (6), each voltage source is known, and in the equation (6), Cx actually represents the base capacitance of the capacitor to be detected.

The third stage (T3): When the first switch K1 is connected to the contact 1, and the second switch K2 is disconnected, the fourth switch K4 is closed. Since the offsetting in the second stage is completed, the third switch K3 may be connected to either the contact 1 or the contact 2, and the charge transfer module performs charge transferring on the base capacitance of the capacitor to be detected.

As long as a circuit design ensures that the base capacitance of the capacitor to be detected and capacitance of the offset capacitor have the relationship in the above equation (6), the influence of the base capacitance of the capacitor to be detected on charge transfer can be eliminated, and only the influence of an external electric field is retained.

The Second Offsetting Process Includes a First Stage to a Third Stage Below:

The first stage (T1): the first switch K1 is connected to the contact 2, the second switch K2 is closed, the third switch K3 is connected to the contact 1, and the fourth switch K4 is disconnected. In this case, one terminal of the capacitor to be detected Cx is grounded, and the other terminal of it is connected to ground through the first switch and the second switch, such that its voltage is 0. One terminal of the offset capacitor Cc is connected to the voltage source Vcc through the first switch and the third switch, and the other terminal of it is connected to the voltage source Vss through another first switch and another third switch, such that it is also in a charging state, and its voltage is Vcc−Vss after charging is completed. In this case, since the third switch is disconnected, the offsetting module is disconnected from the charge transfer module.

The second stage (T2): the first switch K1 is connected to the contact 2, the second switch K2 is disconnected, the connection of the third switch K3 is switched from the contact 1 to the contact 2, and the fourth switch K4 is disconnected. The voltage of the offset capacitor is Vcc−Vcm, and the offset capacitor charges the capacitor to be detected, thereby implementing charge offsetting on the capacitor to be detected Cx through the offset capacitor Cc. The connection of the third switch K3 is switched from the contact 2 to the contact 1, and its voltage is Vcc−Vss after charging is completed; the connection of the third switch K3 is switched from the contact 1 to the contact 2, and the capacitor to be detected recharges the offset capacitor, i.e.,  performing charge offsetting on the capacitor to be detected Cx again, and so on. That is, in the second stage, the third switch K3 alternately switches between the contact 1 and the contact 2, thereby implementing charge offsetting on the capacitor to be detected Cx multiple times (denoted as M times). The voltage of the capacitor to be detected is increased by (Vcc−Vss−Vcc+Vcm)*Cc/Cx each time, and is finally increased to or approximately increased to the common mode voltage. In addition, through multiple times of charge offsetting, the offset capacitor Cc can be designed to be small enough, so as not to occupy too much area of a touch chip.

When the second stage is completed, the influence of base capacitance of the capacitor to be detected is completely eliminated, and then a voltage of both the offset capacitor and the capacitor to be detected is the common mode voltage. Therefore, there is the following equation (7):

$$(Vcm)*Cx=M*Cc*(Vcc-Vss-Vcc+Vcm) \quad (7)$$

Considering that the appropriate size of the offset capacitor needs to be selected in the circuit design stage, the following equation (8) is obtained by transforming the above equation:

$$Cc=[(Vcm)*Cx]/[M*(Vcm-Vss)] \quad (8)$$

In the above equation (7), each voltage source is actually a known quantity, while in the equation (8), Cx actually represents the base capacitance of the capacitor to be detected.

The third stage (T3): When the second switch K2 is disconnected, the fourth switch K4 is closed. Since the offsetting in the second stage is completed, the third switch K3 may be connected to either the contact 1 or the contact 2, and the charge transfer module performs charge transferring on the base capacitance of the capacitor to be detected.

As long as the circuit design ensures that the base capacitance of the capacitor to be detected and capacitance of the offset capacitor have the relationship in the above equation (3), the influence of the base capacitance of the capacitor to be detected on charge transfer can be eliminated, and only the influence of the external electric field is retained.

Therefore, in the circuit design stage, it is only necessary to set the capacitance of the offset capacitor to the base capacitance of the capacitor to be detected, whilst satisfying both of the above equations (6) and (8), and the offset capacitor is preferably a stable capacitor with constant capacitance, i.e., its capacitance will not change due to the influence of the external electric field.

Figure 6:
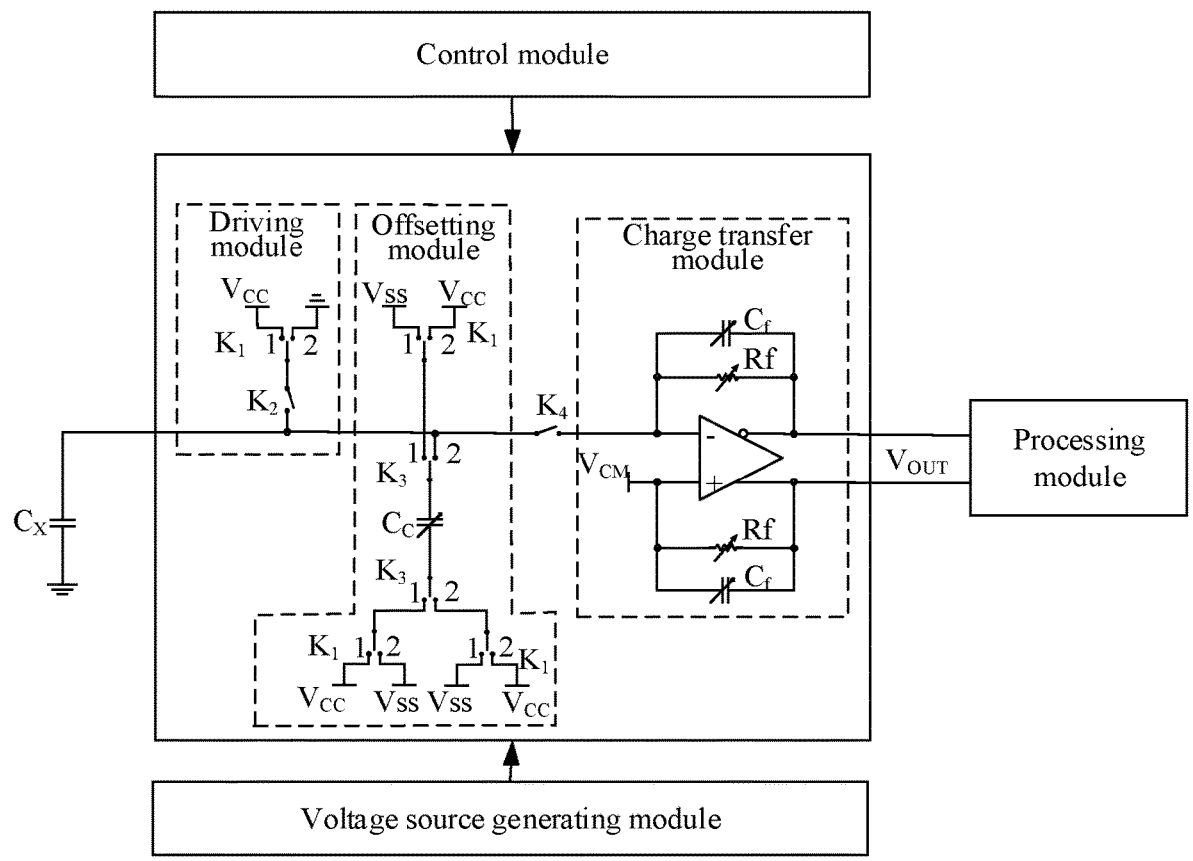
FIG. 6 is a schematic flowchart of a capacitance detection method in embodiment VI of the present disclosure.

FIG. 6 is a schematic structural diagram of a capacitance detection circuit in embodiment VI of the present disclosure. As shown in FIG. 6, different from the structure of the capacitance detection circuit shown in the above FIG. 3A and FIG. 3B, specifically, in the capacitance detection circuit shown in FIG. 3A and FIG. 3B, the voltage source Vss in the driving module is replaced with GND.

With reference to the structure of the capacitance detection circuit shown in FIG. 6, the first offsetting process includes a first stage to a third stage below.

(1) The First Offsetting Process:

The first stage (T1): the first switch K1 is connected to the contact 1, the second switch K2 is closed, the third switch K3 is connected to the contact 1, and the fourth switch K4 is disconnected. In this case, one terminal of the capacitor to be detected Cx is grounded, and the other terminal of it is connected to the voltage source Vcc through the first switch and the second switch, such that it is in a charging state, and its voltage to ground is Vcc after charging is completed. One terminal of the offset capacitor Cc is connected to the voltage source Vss through the first switch and the third switch, and the other terminal of it is connected to the voltage source Vcc through another first switch and another third switch, such that it is also in a charging state, and its voltage to ground is Vcc−Vss after charging is completed. In this case, since the third switch is disconnected, the offsetting module is disconnected from the charge transfer module.

The second stage (T2): The first switch K1 is connected to the contact 1, the second switch K2 is disconnected, the connection of the third switch K3 is switched from the contact 1 to the contact 2, and the fourth switch K4 is disconnected. The voltage to ground of the offset capacitor jumps to Vss−Vcm, which is lower than the voltage Vcc of the capacitor to be detected Cx, and the capacitor to be detected Cx charges the offset capacitor Cc, thereby implementing charge offsetting on the capacitor to be detected Cx through the offset capacitor Cc. The connection of the third switch K3 is switched from the contact 2 to the contact 1, and its voltage to ground is Vcc−Vss after charging is completed. The connection of the third switch K3 is switched from the contact 1 to the contact 2, the capacitor to be detected positively charges the offset capacitor again, i.e., performing charge offsetting on the capacitor to be detected Cx again, and so on. That is, in the second stage, the third switch K3 alternately switches between the contact 1 and the contact 2, thereby implementing charge offsetting on the capacitor to be detected Cx multiple times (denoted as M times). The voltage of the capacitor to be detected is decreased by (Vcc−Vss−(Vss−Vcm))*Cc/Cx each time, and is finally decreased to or approximately decreased to the common mode voltage.

Here, it should be noted that, since two first switches are also configured in the offsetting module, the two first switches are required to be involved in charging and discharging of the offset capacitor Cc. The connection between the first switch and the contact is only required to ensure that a voltage of the offset capacitor can reach Vcc−Vss when the third switch is connected to the contact 1, while the capacitor to be detected can discharge the offset capacitor when the third switch is connected to the contact 2. Therefore, for example, in the embodiment of FIG. 3A, the offsetting module is connected to the voltage source Vcc when one of its first switches is connected to the contact 1, and is connected to the voltage source Vss when the first switch is connected to the contact 2; otherwise the offsetting module is connected to the voltage source Vss when the other first switch is connected to the contact 1, and is connected to the voltage source Vcc when the other first switch is connected to the contact 2.

When the second stage is completed, the influence of the base capacitance of the capacitor to be detected is completely eliminated. If there is no touch, Vout=0. In this case, a voltage of a negative phase terminal of a differential amplifier is Vcm, i.e., both the voltage to ground of the offset capacitor and a voltage to ground of the capacitor to be detected is the common mode voltage Vcm. Therefore, there is the following equation (9):

$$(Vcc-Vcm)*Cx=M*Cc*(Vcc-Vss-(Vss-Vcm)) \quad (9)$$

Considering that an appropriate size of the offset capacitor needs to be selected in a circuit design stage, the following equation (10) is obtained by transforming the above equation:

$$Cc=[(Vcc-Vcm)*Cx]/[M*(Vcc-2Vss+Vcm)] \quad (10)$$

In the above equation (10), each voltage source is known, and in the equation (10), Cx actually represents the base capacitance of the capacitor to be detected.

The third stage (T3): When the second switch K2 is disconnected, the fourth switch K4 is closed. Since the offsetting in the second stage is completed, the third switch K3 may be connected to either the contact 1 or the contact 2, and the charge transfer module performs charge transferring on the capacitor to be detected.

The Second Offsetting Process Includes a First Stage to a Third Stage Below:

The first stage (T1): the first switch K1 is connected to the contact 2, the second switch K2 is closed, the third switch K3 is connected to the contact 1, and the fourth switch K4 is disconnected. In this case, one terminal of the capacitor to be detected Cx is grounded, and the other terminal of it is connected to Gnd through the first switch and the second switch. One terminal of the offset capacitor Cc is connected to the voltage source Vcc through the first switch and the third switch, the other terminal of it is connected to the voltage source Vss through another first switch and another third switch, it is in a charging state, and its voltage to ground is Vcc−Vss after charging is completed. In this case, since the third switch is disconnected, the offsetting module is disconnected from the charge transfer module.

The second stage (T2): The first switch K1 is connected to the contact 2, the second switch K2 is disconnected, the connection of the third switch K3 is switched from the contact 1 to the contact 2, and the fourth switch K4 is disconnected. The voltage to ground of the offset capacitor jumps to Vcm−Vcc, and the offset capacitor charges the capacitor to be detected, thereby implementing charge offsetting on the capacitor to be detected Cx through the offset capacitor Cc. The connection of the third switch K3 is switched from the contact 2 to the contact 1, and the voltage to ground of the offset capacitor is Vcc−Vss after discharging is completed; the connection of the third switch K3 is switched from the contact 1 to the contact 2, and the capacitor to be detected recharges the offset capacitor, i.e., performing charge offsetting on the capacitor to be detected Cx again, and so on. That is, in the second stage, the third switch K3 alternately switches between the contact 1 and the contact 2, thereby implementing charge offsetting on the capacitor to be detected Cx multiple times (denoted as M times). The voltage of the capacitor to be detected is increased by (Vcc−Vss−Vcm+Vcc)*Cc/Cx each time, and is finally increased to or approximately increased to the common mode voltage. In addition, through multiple times of charge offsetting, the offset capacitor Cc can be designed to be small enough, so as not to occupy too much area of a touch chip.

When the second stage is completed, the influence of base capacitance of the capacitor to be detected is completely eliminated, and then a voltage of both the offset capacitor and the capacitor to be detected is the common mode voltage. Therefore, there is the following equation (11):

$$(Vcm)*Cx=M*Cc*(Vcc-Vss-Vcm+Vcc) \quad (11)$$

Considering that an appropriate size of the offset capacitor needs to be selected in a circuit design stage, the following equation (12) is obtained by transforming the above equation:

$$Cc=[(Vcm)*Cx]/[M*(2Vcc-Vss-Vcm)] \quad (12)$$

In the above equation (12), each voltage source is actually a known quantity, while in the equation (12), Cx actually represents the base capacitance of the capacitor to be detected.

The third stage (T3): When the second switch K2 is disconnected, the fourth switch K4 is closed. Since the offsetting in the second stage is completed, the third switch K3 may be connected to either the contact 1 or the contact 2, and the charge transfer module performs charge transferring on the capacitor to be detected.

Therefore, in the circuit design stage, it is only necessary to set the capacitance of the offset capacitor to the base capacitance of the capacitor to be detected, whilst satisfying both of the above equations (10) and (12), and the offset capacitor is preferably a stable capacitor with constant capacitance, i.e., its capacitance will not change due to the influence of the external electric field.

Figure 7:
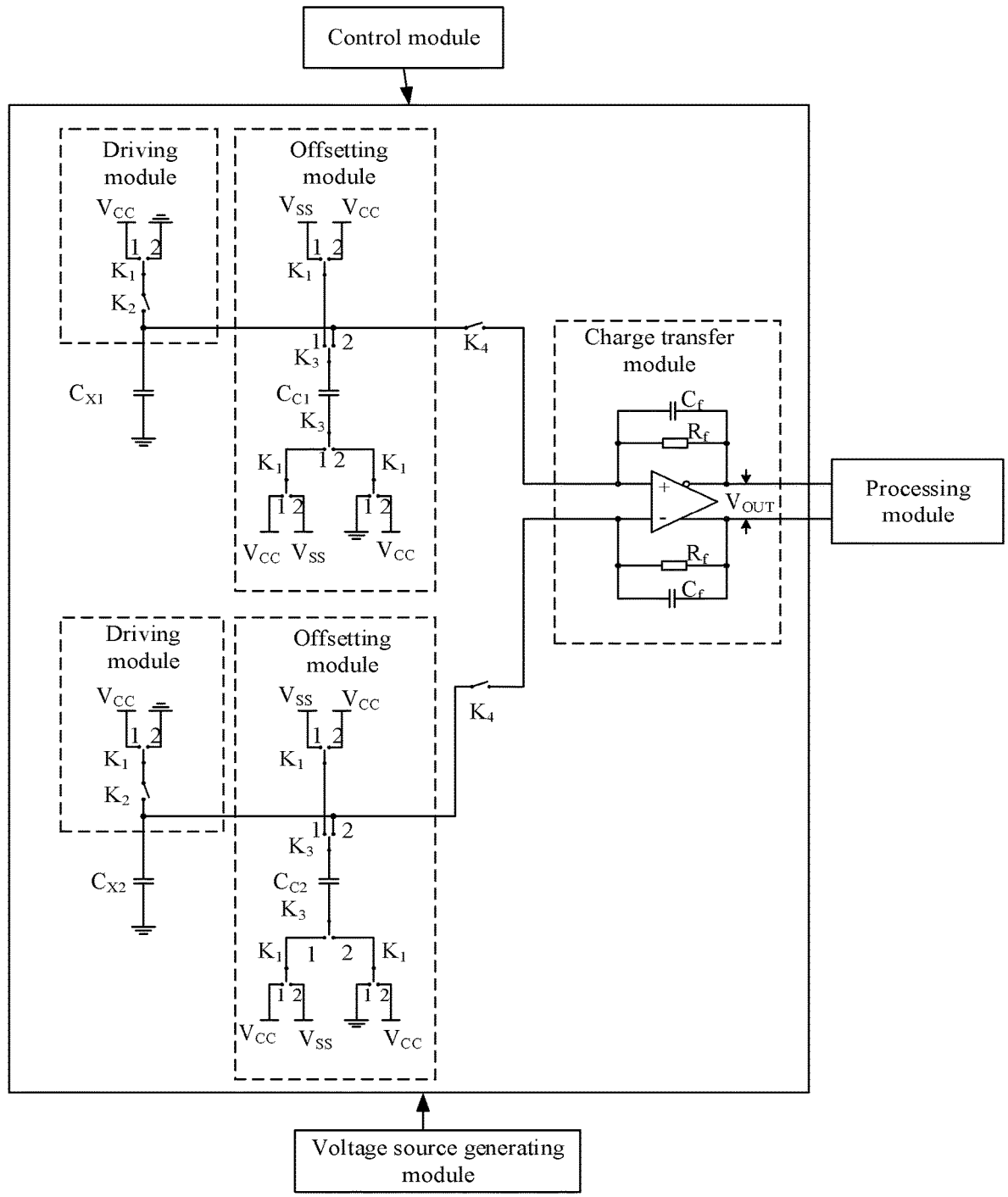
FIG. 7 is a schematic flowchart of a capacitance detection method in embodiment VII of the present disclosure.

FIG. 7 is a schematic structural diagram of a capacitance detection circuit in embodiment VII of the present disclosure. As shown in FIG. 7, a driving module and an offsetting module are provided respectively for capacitor to be detecteds Cx1 and Cx2. Different from the above embodiments, in the charge transferring stage, the capacitor to be detecteds Cx1 and Cx2 are connected to a differential amplifier (e.g., a double-terminal differential amplifier) in the charge transferring respectively, and in fact, transfer charges to the charge transfer module simultaneously.

After the second stage in the first offsetting process is completed, a voltage to system ground of the capacitor to be detected Cx1 is $u_{11}(t2)=Vcc-M*(Vcc-Vss-Vcm)*Cc1/Cx1$. A voltage to system ground of the capacitor to be detected Cx2 is $u_{12}(t2)=Vcc-M*(Vcc-Vss-Vcm)*Cc2/Cx2$: In the third stage, the amount of charges transferred from the capacitor to be detected Cx1 to the charge transfer module is: $\Delta Q=[u_{11}(t_2)-V_{CM}]C_{X1}$, and the amount of charges transferred from the capacitor to be detected Cx2 to the charge transfer module is $\Delta Q_2=[u_{22}(t_2)-V_{CM}]C_{X2}$. Based on sizes of $\Delta Q1$ and $\Delta Q2$, there are the following situations:

if $\Delta Q1>\Delta Q2$, an output voltage (Vout) of an amplifying circuit is a negative voltage;

if $\Delta Q1=\Delta Q2$, the output voltage (Vout) of the amplifying circuit is 0; and if $\Delta Q1<\Delta Q2$, the output voltage (Vout) of the amplifying circuit is a positive voltage.

Similarly, after the second stage in the second offsetting process is completed, a voltage to system ground of the capacitor to be detected Cx1 is $u_{21}(t2)=M*(Vcc-Vss-Vcc+Vcm)*Cc1/Cx1$. A voltage to system ground of the capacitor to be detected Cx1 is $u_{22}(t2)=M*(Vcc-Vss-Vcc+Vcm)*Cc2/Cx2$: In the third stage, the amount of charges transferred from the capacitor to be detected Cx1 to the charge transfer module is: $\Delta Q_1=[u_{21}(t2)-V_{CM}]C_{X1}$, and the amount of charges transferred from the capacitor to be detected Cx2 to the charge transfer module is $\Delta Q_2=[u_{22}(t_2)-V_{CM}]C_{X2}$. Based on the sizes of $\Delta Q1$ and $\Delta Q2$, there are the following situations:

if $\Delta Q1>\Delta Q2$, an output voltage (Vout) of an amplifying circuit is a negative voltage;

if $\Delta Q1=\Delta Q2$, the output voltage (Vout) of the amplifying circuit is 0; and if $\Delta Q1<\Delta Q2$, the output voltage (Vout) of the amplifying circuit is a positive voltage.

In terms of circuit design, from the theoretical perspective, charges in both the first offsetting process and the second offsetting process are perfectly offset, i.e., $\Delta Q1=\Delta Q2$ is realized.

In this embodiment, charging, offsetting, and charge transferring on the two capacitor to be detecteds are performed at the same moment, and amplified signals are outputted to a post-stage circuit through the differential amplifier. In a touch control system, adjacent detection channels tend to have similar base capacitance, have similar temperature drifts during temperature change, and have similar noise characteristics. Therefore, this embodiment can suppress noise, can improve the signal-to-noise ratio, and has the ability to suppress the temperature drift. Further, when an external electric field is caused by a touch, which of the two capacitor to be detecteds has a larger capacitance variation may also be determined based on a direction of the Vout in the above embodiment III, and then a position of the touch may be further determined based on a relative size relationship of the capacitance.

It should be noted that in the above embodiments, the first switch to the fourth switch may have a single switch structure, or may have any combined circuit structure that can achieve the same technical functions.

In addition, in the above embodiments, no matter in the first offsetting process or the second offsetting process, actually a given offset capacitor plays a role in substantially offsetting, thereby simplifying the circuit design, or, in other words, reducing the cost of the circuit design.

Accordingly, in terms of the specific circuit structure of the offsetting module, it includes three first switches K1, two third switches K3, an offset capacitor Cc, a voltage source Vcc, and a voltage source Vss. Each of the first switches K1 corresponds to two contacts, namely the contact 1 and the contact 2, for connection to the voltage source Vcc or Vss, thereby forming the first offsetting process or the second offsetting process. At the same time, either of the third switches K3 also corresponds to two contacts, namely the contact 1, the contact 2, and the offset capacitor Cc is arranged between the two third switches K3, such that when the contact of the third switch K3 is switched, the given offset capacitor is involved in the first offsetting process or the second offsetting process.

An embodiment of the present disclosure further provides an electronic device, including the touch chip according to any one embodiment of the present disclosure.

In the above embodiments, considering that the offset capacitor Cc is integrated into the touch chip, the lower is the offset capacitor, the smaller are the area and cost of the touch chip. Thus, in a specific application scenario, an offset capacitor with smallest capacitance is preferably selected to form the capacitance detection circuit on the premise of reducing detected base capacitance of the capacitor to be detected.

In addition, when implementing touch control detection based on mutual capacitance detection, if base capacitance of the mutual capacitance is high enough to affect the variation rate of the mutual capacitance, the following concepts of the embodiment of the present disclosure may also be applied.

The electronic device in the embodiment of the present disclosure exists in various forms, including but not limited to:

(1) a mobile communication device: Such a device is characterized by having mobile communication functions, and is mainly intended to provide voice and data communication. Such a terminal includes: a smart phone (e.g., an iPhone), a multimedia phone, a functional phone, a low-end phone, and the like.

(2) an ultra-mobile personal computer device: Such a device belongs to a category of personal computers, has computing and processing functions, and generally also has the characteristics of mobile Internet access. Such a terminal includes: a device, such as a PDA, a MID, and a UMPC, e.g., an iPad.

(3) a portable entertainment device: Such a device can display and play multimedia contents. Such a device includes: an audio player, a video player (e.g., an iPod), a handheld game player, an e-book, a smart toy, and a portable vehicle navigation device.

(4) a server: a device providing a computing service. The server components include a processor, a hard disk, an internal memory, a system bus, etc. A structure of the server is similar to that of a general computer. But because of the needs of providing a highly reliable service, the requirements in respect of processing capacity, stability, reliability, security, scalability, manageability, etc. are very high.

(5) other electronic apparatuses having data interaction functions.

So far, specific embodiments of the present subject matter have been described. Other embodiments fall within the scope of the appended claims. In some cases, actions disclosed in the appended claims may be performed in different orders and can still achieve the desired results. In addition, the processes depicted in the figures do not necessarily require the shown particular order or sequential order, to achieve desired results. In some embodiments, multitasking and parallel processing may be advantageous.

It should be further noted that the terms such as "comprising", "including" or any other variation thereof are intended to cover non-exclusive inclusions, such that a process, method, article, or device that includes a series of elements not only includes those elements, but also includes other elements that are not explicitly listed, or further includes elements that are inherent to such process, method, article, or device. An element preceded by the wording "comprises a . . . " does not, without more constraints, preclude the existence of additional identical elements in the process, method, article, or device that includes the element.

Various embodiments in the present specification are described progressively, identical or similar portions of various embodiments may be mutually referred to, and differences of each embodiment from other embodiments are mainly described in the embodiment. In particular, embodiments of the system are substantially similar to embodiments of the method, and therefore, the description is relatively simple. A part of description of the embodiments of the method may be referred to for relevant parts.

The above description merely provides embodiments of the present disclosure, and is not intended to limit the present disclosure. For those skilled in the art, the present disclosure may have various modifications and alterations. Any modification, equivalent replacement, improvement, and the like made within the spirit and principles of the present disclosure should be included within the scope of the appended claims of the present disclosure.

What is claimed is:

1. A capacitance detection method, N first offsetting processes and M second offsetting processes constituting a detection period during detection, wherein N, M≥1, the method comprising:

performing charging, base capacitance offsetting, and charge transferring successively on a capacitor to be detected in an i-th first offsetting process of the first offsetting processes, to generate a first output voltage, wherein i≤N;

performing discharging, base capacitance offsetting, and charge transferring on the capacitor to be detected successively in a j-th second offsetting process of the second offsetting processes, to generate a second output voltage, wherein j≤M; and determining a capacitance variation of the capacitor to be detected before and after the capacitor to be detected is affected by an external electric field based on the first output voltages corresponding to the N first offsetting processes and the second output voltages corresponding to the M second offsetting processes in the detection period, wherein performing the base capacitance offsetting on the capacitor to be detected in the i-th first offsetting process comprises: performing a plurality of times of first offsetting operations on the capacitor to be detected until charges corresponding the base capacitance of the capacitor to be detected are offset in the i-th first offsetting process, each of the plurality of times of first offsetting operations comprising: charging an offset capacitor to a voltage of a voltage source Vcc minus a voltage source Vss; and performing charge offsetting on the capacitor to be detected through the charged offset capacitor; and wherein performing the base capacitance offsetting on the capacitor to be detected in the j-th second offsetting process comprises: performing a plurality of times of second offsetting operations on the capacitor to be detected until the charges corresponding the base capacitance of the capacitor to be detected are offset in the j-th second offsetting process, each of the plurality of times of second offsetting operations comprising: charging an offset capacitor to a voltage of a voltage source Vss minus a voltage source Vcc; and performing charge offsetting on the capacitor to be detected through the charged offset capacitor.

2. The method according to claim 1, further comprising: switching between the first offsetting process and the second offsetting process under the control of a first switching module.

3. The method according to claim 2, wherein the first switching module comprises at least three first switches, wherein at least one of the first switches is provided in a driving module configured to charge the capacitor to be detected in a first offsetting stage or discharge the capacitor to be detected in a second offsetting stage, and at least two other first switches of the first switches are provided in an offsetting module configured to perform base capacitance offsetting on the capacitor to be detected.

4. The method according to claim 1, further comprising: charging and discharging the offset capacitor by the offsetting module under the control of a third switching module, to perform base capacitance offsetting on the capacitor to be detected in the i-th first offsetting process or the j-th second offsetting process.

5. The method according to claim 4, wherein the charging and discharging the offset capacitor under the control of a third switching module, to perform base capacitance offsetting on the capacitor to be detected in the i-th first offsetting process comprises: charging and discharging the offset capacitor under the control of the third switching module such that a voltage of the capacitor to be detected is decreased to implement base capacitance offsetting on the capacitor to be detected.

6. The method according to claim 5, wherein the third switching module comprises at least two third switches, and the at least two third switches are provided in the offsetting module.

7. The method according to claim 4, wherein the charging and discharging the offset capacitor by the offsetting module under the control of a third switching module, to perform base capacitance offsetting on the capacitor to be detected in the i-th first offsetting process or the j-th second offsetting process comprises: charging and discharging the offset capacitor under the control of the third switching module such that the voltage of the capacitor to be detected is increased to implement base capacitance offsetting on the capacitor to be detected.

8. The method according to claim 1, wherein under the control of a fourth switching module, charge transferring on the capacitor to be detected is performed in the i-th first offsetting process or charge transferring on the capacitor to be detected is performed in the j-th second offsetting process.

9. The method according to claim 8, wherein the fourth switching module comprises at least one fourth switch, and the fourth switch is configured to enable the capacitor to be detected to be in a charge transferring state in the i-th first offsetting process, or enable the capacitor to be detected to be in a charge transferring state in the j-th second offsetting process.

10. The method according to claim 1, wherein the N first offsetting processes precede the M second offsetting processes, or the i-th first offsetting process alternates with the j-th second offsetting process.

11. The method according to claim 1, wherein N=M, and i=j.

12. A capacitance detection circuit, comprising: a control module, a driving module, an offsetting module, a charge transfer module, and a processing module; N first offsetting processes and M second offsetting processes constituting a detection period during detection, wherein N, M≥1;

the control module is configured to control the driving module, the offsetting module, and the charge transfer module performing charging, base capacitance offsetting, and charge transferring successively on a capacitor to be detected in an i-th first offsetting process of the first offsetting processes, respectively, to generate a first output voltage, wherein i≤N;

the control module is configured to control the driving module, the offsetting module, and the charge transfer module performing discharging, base capacitance offsetting, and charge transferring on the capacitor to be detected successively in a j-th second offsetting process of the second offsetting processes, respectively, to generate a second output voltage, wherein j≤M; and the processing module is configured to determine a capacitance variation of the capacitor to be detected before and after the capacitor to be detected is affected by an external electric field based on the first output voltages corresponding to the N first offsetting processes and the second output voltages corresponding to the M second offsetting processes in the detection period, wherein:

the offsetting module comprises an offset capacitor, and
the control module is further configured to control the offset capacitor to perform a plurality of times of first offsetting operations on the capacitor to be detected until charges corresponding the base capacitance of the capacitor to be detected are offset in the i-th first offsetting process, each of the plurality of times of first offsetting operations comprising: charging an offset capacitor to a voltage of a voltage source Vcc minus a voltage source Vss; and performing charge offsetting on the capacitor to be detected through the charged offset capacitor; and the control module is further configured to control the offset capacitor to perform a plurality of times of second offsetting operations on the capacitor to be detected until the charges corresponding the base capacitance of the capacitor to be detected are offset in the j-th second offsetting process, each of the plurality of times of second offsetting operations comprising: charging an offset capacitor to a voltage of a voltage source Vss minus a voltage source Vcc; and performing charge offsetting on the capacitor to be detected through the charged offset capacitor.

13. The circuit according to claim 12, further comprising a first switching module, wherein switching between the first offsetting process and the second offsetting process is performed under the control of the first switching module.

14. The circuit according to claim 13, wherein the first switching module comprises at least three first switches, wherein at least one of the first switches is provided in the driving module configured to charge the capacitor to be detected in a first offsetting stage or discharge the capacitor to be detected in a second offsetting stage, and at least two other first switches of the first switches are provided in the offsetting module configured to perform base capacitance offsetting on the capacitor to be detected.

15. The circuit according to claim 12, wherein the offsetting module charges and discharges the offset capacitor under the control of a third switching module, to perform base capacitance offsetting on the capacitor to be detected in the i-th first offsetting process or the j-th second offsetting process.

16. The circuit according to claim 12, further comprising a fourth switching module, wherein under the control of the fourth switching module, charge transferring on the capacitor to be detected is performed in the i-th first offsetting process or charge transferring on the capacitor to be detected is performed in the j-th second offsetting process.

17. The circuit according to claim 16, wherein the fourth switching module comprises at least one fourth switch, and the fourth switch is configured to enable the capacitor to be detected to be in a charge transferring state in the i-th first offsetting process, or enable the capacitor to be detected to be in a charge transferring state in the j-th second offsetting process.

18. The circuit according to claim 12, wherein N=M, and i=j.

* * * * *